United States Patent
Yang et al.

(12) 
(10) Patent No.: US 6,211,083 B1
(45) Date of Patent: Apr. 3, 2001

(54) USE OF A NOVEL CAPPED ANNEAL PROCEDURE TO IMPROVE SALICIDE FORMATION

(75) Inventors: Jiunn-Der Yang; Chaucer Chung; Yuan-Chang Huang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/550,263

(22) Filed: Apr. 17, 2000

(51) Int. Cl.[7] .................................................. H01L 21/4763
(52) U.S. Cl. .......................... 438/682; 438/648; 438/647; 438/651; 438/655
(58) Field of Search .................................... 438/649, 648, 438/647, 651, 655, 299, 682

(56) References Cited

U.S. PATENT DOCUMENTS

| | | | |
|---|---|---|---|
| 4,923,822 | 5/1990 | Wang et al. | 438/297 |
| 5,384,285 | 1/1995 | Sitaram et al. | 438/664 |
| 5,593,924 * | 1/1997 | Apte et al. | 438/647 |
| 5,960,319 * | 9/1999 | Iwata et al. | 438/664 |
| 5,970,370 | 10/1999 | Besser et al. | 438/586 |
| 6,001,721 | 12/1999 | Huang | 438/597 |
| 6,107,131 * | 8/2000 | Huang | 438/238 |

* cited by examiner

*Primary Examiner*—Wael Fahmy
*Assistant Examiner*—Hsien-Ming Lee
(74) *Attorney, Agent, or Firm*—George O. Saile; Stephen B. Ackerman

(57) ABSTRACT

A process for forming a low resistance, titanium disilicide layer, on regions of a MOSFET device, has been developed. The process features the deposition of a capping, silicon oxide layer, on first phase, high resistance, titanium disilicide regions. The capping, silicon oxide layer, featuring a compressive stress, reduces the risk of titanium disilicide regions, formed with a tensile stress, from adhesion loss, or peeling, from underlying regions of the MOSFET device, such as from the top surface of a narrow width, polysilicon gate structure. In addition the capping silicon oxide layer protects underlying titanium disilicide regions from the ambient used during the anneal cycle used to convert the first phase, high resistance, titanium disilicide region, to the second phase, low resistance, titanium disilicide region.

18 Claims, 3 Drawing Sheets

USE OF A NOVEL CAPPED ANNEAL PROCEDURE TO IMPROVE SALICIDE FORMATION

BACKGROUND OF THE INVENTION

1. Field of the Invention

The present invention relates to methods used to fabricate semiconductor devices, and more specifically to a process used to form Self-ALIgned metal siliCIDE, (SALICIDE), regions on polysilicon, as well as on single crystalline silicon regions.

2. Description of Prior Art

The use of salicide on specific regions of metal oxide semiconductor field effect transistor, (MOSFET), devices, has been used to increase device performance. Salicide, or self-aligned metal silicide layers, such as titanium disilicide or cobalt disilicide, on MOSFET polysilicon gate structures, or word lines, or on MOSFET source/drain regions, decrease the resistance of these elements, thus resulting in the desired increase in MOSFET performance. However the trend to very narrow polysilicon word lines has presented difficulties in obtaining the desired salicide resistance, as well as sometimes resulting in adhesion loss between the salicide regions and the underlying, narrow width, polysilicon gate structure, thus suggesting the need for optimization of the salicide formation process.

A process sequence now being used for salicide formation entails deposition of a metal layer, such as titanium, followed by a first anneal procedure, resulting in a high resistance phase, (C49), of metal silicide, on regions on which the metal overlaid either polysilicon, or single crystalline silicon. After removal of unreacted metal, from the surface of insulator layers, such as spacers on the sides of word line structures, a second anneal is performed to convert the high resistance, metal silicide, to a lower resistance, second phase, or a C54 phase of metal silicide. However the high tensile stress of metal silicide, on narrow width, polysilicon gate structures, or word lines, can result in a greater degree of distortion of the polysilicon word line, or a greater degree of metal silicide peeling from the underlying, narrow width, polysilicon word line, when compared to counterparts comprised of metal silicide overlaying wider width, polysilicon gate structures, or word lines. In addition the exposure of the metal silicide, C49 phase to the ambient used for the second anneal procedure, can result in inclusion of oxygen and nitrogen in the metal silicide layer, not allowing the lower resistance offered by metal silicide, C54 phase to be realized.

This invention will describe a process sequence for formation of salicide layers, on narrow width, polysilicon gate structuresm, or word line, in which a capping layer of silicon oxide, with a compressive stress, is used to alleviate the tensile stress phenomena exhibited by the metal silicide layer, during the second anneal procedure, thus reducing the peeling of metal silicide from narrow width, polysilicon word lines. In addition the use of the capping silicon oxide layer, deposited prior to the second anneal procedure, protects the underlying metal silicide layer from inclusion of resistance increasing oxygen, and nitrogen, present in the anneal ambient. Prior art such as Apte et al, in U.S. Pat. No. 5,593,924, describe a salicide process in which a titanium nitride capping layer is used. However the use of a titanium nitride capping layer, may not neutralize the tensile stress of subsequent metal silicide layers. In addition that prior art uses a first capping layer, overlaying the metal layer prior to formation of a metal silicide layer, with the first capping layer removed prior to the second anneal procedure. That in turn subjects the first phase of the metal silicide layer to the capping layer removal procedure, wherein the present invention, in which the capping layer can remain as part of the final MOSFET structure, does not allow the C49, or the C54 metal silicide phase to be subjected to the capping layer removal procedure, which can degrade the exposed metal silicide layers.

SUMMARY OF THE INVENTION

It is an object of this invention to form a metal silicide layer on a polysilicon gate structure, or word line, and on a source/drain region, of a MOSFET device.

It is another object of this invention to initially form a C49 phase, metal silicide layer, followed by an anneal procedure, used to convert the C49 phase, metal silicide layer, to a lower resistance, C54 phase, metal silicide layer.

It is still another object of this invention to deposit a capping silicon oxide layer, prior to the anneal procedure, used to convert the C49 phase, metal silicide layer, to the C54 phase, metal silicide layer.

In accordance with the present invention, a method of forming a low resistance, metal silicide layer, on a polysilicon gate structure, or word line, as well as on a source/drain region, of a MOSFET device, featuring the use of a silicon oxide, capping layer, formed prior to an anneal cycle, used to convert a high resistance, metal silicide layer, to a lower resistance, metal silicide layer, is described. After formation of a polysilicon gate structure, on an underlying gate insulator layer, a lightly doped source/drain region is formed in an area of a semiconductor substrate, not covered by the polysilicon gate structure. After formation of insulator spacers, on the sides of the polysilicon gate structure, or word line, a heavily doped source/drain region is formed in an area of the semiconductor substrate, not covered by the polysilicon word line structure, or by the insulator spacers. After deposition of a metal layer, a first anneal procedure is used to form a high resistance, metal silicide layer on the top surface of the polysilicon word line structure, and on the surface of the heavily doped source/drain region. After removal of unreacted metal, from the surface of the insulator spacers, a capping, silicon oxide layer is deposited. A second anneal procedure is then performed converting the high resistance, metal silicide layer, underlying the capping, silicon oxide layer, to a lower resistance, metal silicide layer. Deposition of an interlevel dielectric layer, (ILD), overlying the capping, silicon oxide layer, is followed by contact hole openings in the ILD and the capping silicon oxide layer, exposing a portion of the top surface of the low resistance, metal silicide layer, in a region overlying the heavily doped, source/drain region. A metal plug structure is then formed in the contact hole.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a low resistance salicide layer, on regions of a MOSFET device, featuring a capping silicon oxide layer, deposited on an underlying high resistance salicide layer, prior to an anneal procedure, used to convert the underlying high resistance salicide layer to a lower resistance salicide layer, will now be described in detail. The MOSFET device illustrated in this invention is an N channel device, comprised with an N type source/drain region, as well as an N type doped, polysilicon gate structure, however this invention can also be applied to P channel, MOSFET devices, comprised with a P type doped, source/drain region, and a P type doped, polysilicon gate structure.

Figure 1:
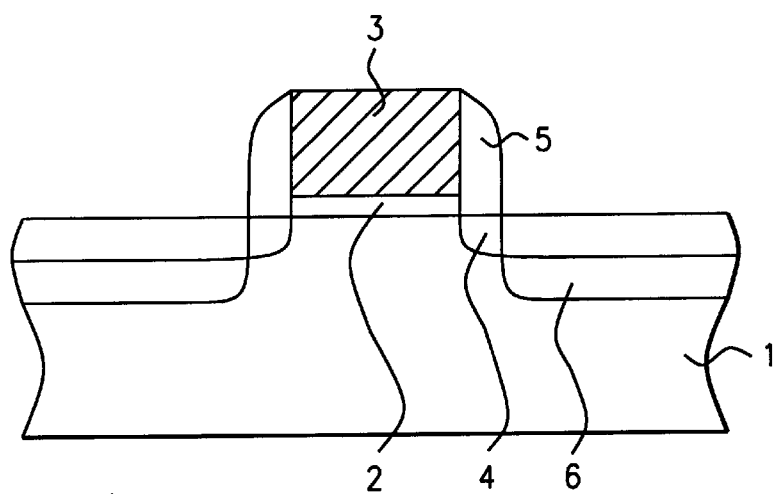
FIGS. 1–7, which schematically, in cross-sectional style, describe key stages of fabrication used to form a salicide layer, on a MOSFET device, featuring the use of a capping silicon oxide layer, deposited prior to, and used to protect an underlying salicide layer, from an anneal procedure, used to convert the underlying salicide layer to a lower resistance salicide layer.

FIG. 1, schematically shows a MOSFET device structure, prior to the initiation of the salicide formation process. A P type, semiconductor substrate 1, comprised of single crystalline silicon, with a <100> crystallographic orientation, is used. A silicon dioxide, gate insulator layer 2, is next thermally grown in an oxygen-steam ambient, to a thickness between about 45 to 55 Angstroms. A polysilicon layer is next deposited via low pressure chemical vapor deposition, (PCVD), procedures, to a thickness between about 1800 to 2200 Angstroms. The polysilicon layer is either doped in situ, during deposition, via the addition of arsine, or phosphine to a silane ambient, or the polysilicon layer can be deposited intrinsically, then doped via implantation of arsenic, or phosphorous ions. Conventional photolithographic and anisotropic, reactive ion etching, (RIE), procedures, using $Cl_2$ or $SF_6$, are used to define polysilicon gate structure, or polysilicon word line 3, schematically shown in FIG. 1. The width of polysilicon gate structure 3, is between about 2000 to 2400 Angstroms. After removal of the photoresist shape, used to define polysilicon gate structure 3, via plasma oxygen ashing and careful wet cleans, lightly doped source/drain region 4, is formed via ion implantation of arsenic, or phosphorous ions, at an energy between about 35 to 45 KeV, at a dose between about 7E13 to 9E13 atoms/$cm^2$. An insulator layer, such as silicon dioxide, or silicon nitride, is next deposited via LPCVD, or via plasma enhanced chemical vapor deposition, (PECVD), procedures, to a thickness between about 1300 to 1700 Angstroms. An anisotropic RIE procedure, using $CHF_3$ or $CF_4$ is employed to create insulator spacers 5, on the sides of polysilicon gate structure 3. Another ion implantation procedure, using again using arsenic or phosphorous ions, at an energy between about 45 to 60 KeV, and at a dose between about 4E14 to 6E14 atoms/$cm^2$, is used to form heavily doped source/drain region 6, in a region of semiconductor substrate 1, not covered by polysilicon gate structure 3, or by insulator spacers 5. This is schematically shown in FIG. 1.

Figure 2:
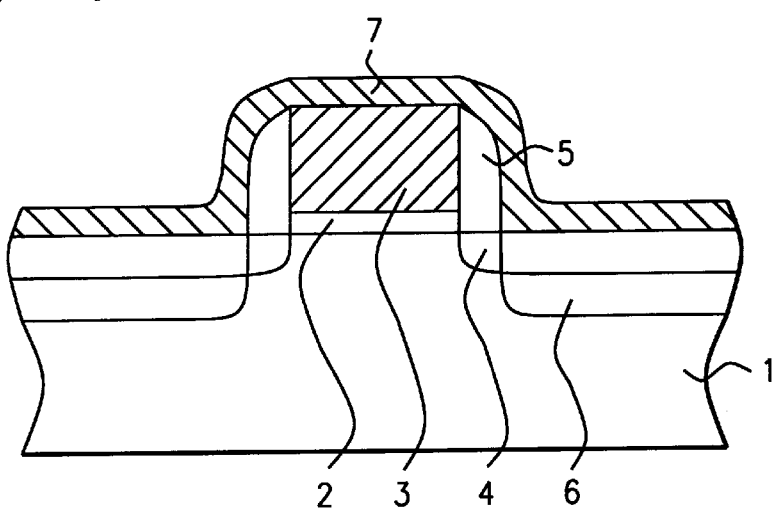
Figure 3:
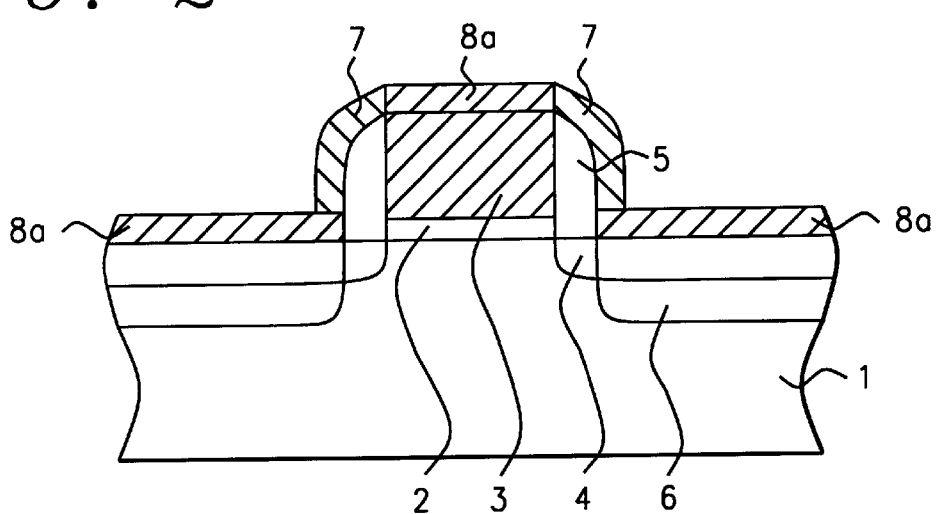

Metal layer 7, such as titanium, is next deposited via a plasma vapor deposition, (PVD), procedure, such as sputtering, to a thickness between about 250 to 350 Angstroms. This is schematically shown in FIG. 2. Other metals, such as cobalt, can also be used for metal layer 7, if desired. A first rapid thermal anneal, (RTA), procedure is next performed, at a temperature between about 700 to 770° C., for a time between about 25 to 35 sec, in an nitrogen or argon ambient, resulting in the formation of metal silicide, or titanium disilicide layer 8a, in regions in which metal layer 7, overlaid the top surface of polysilicon gate structure 3, and heavily doped source/drain region 6. Metal layer 7, remained unreacted in regions overlying insulator spacers 5. This is schematically shown in FIG. 3. Metal silicide, or salicide, (Self- ALIgned siliCIDE), such as titanium disilicide layer 8a, is formed using RTA conditions that allow subsequent, selective removal of unreacted titanium to be accomplished from the surface of insulator spacers 5, without degrading titanium disilicide layer 8a, during this selective wet process. This results in a phase of titanium disilicide layer 8a, exhibiting a sheet resistance between about 20 to 25 ohms/square, and is identified as the C49 salicide phase. The use of a more robust set of RTA conditions, would have created a lower sheet resistance phase of metal silicide, however at the expense of bridging between the metal silicide regions formed on the polysilicon gate structure, and on the heavily source/drain region, resulting in a deleterious gate to substrate shorting phenomena. In addition if the more robust, or lower resistance, metal silicide phase were formed prior to removal of unreacted metal, it can be damaged if subjected to the selective process used to remove unreacted metal. Therefore the attainment of the lower sheet resistance, metal silicide layer, or the C54 salicide phase, is delayed until unreacted metal is removed from the surface of insulator spacers 5.

Figure 4:
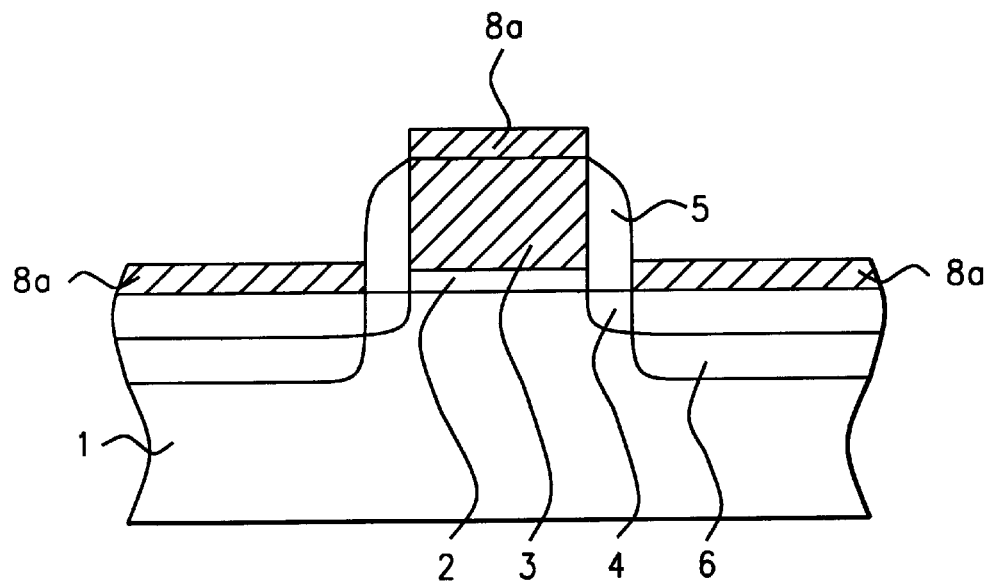
Figure 5:
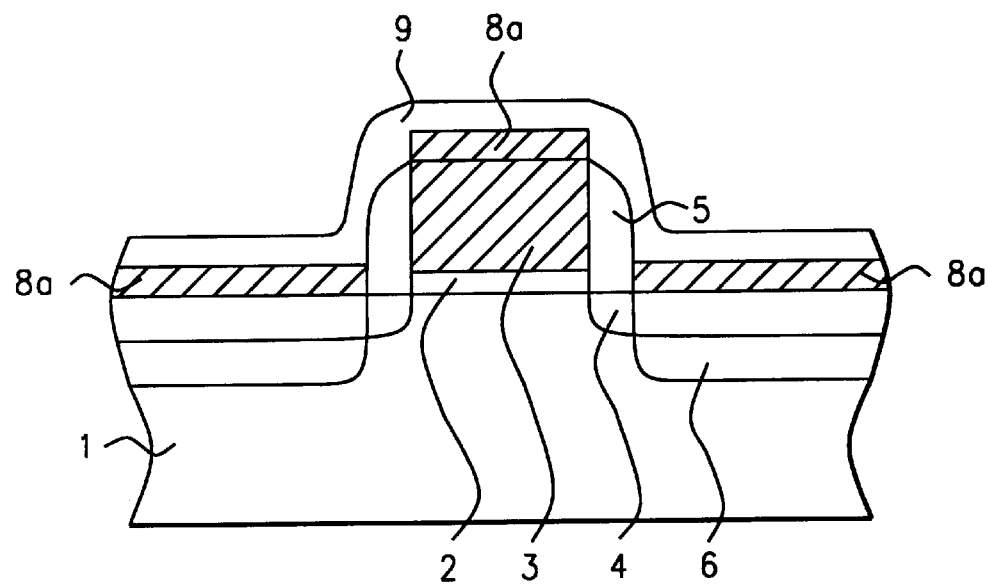

Removal of unreacted metal, or titanium layer 7, from the surface of insulator spacers 5, is accomplished selectively, via a wet etch procedure, using a solution comprised of $H_2SO_4$—$H_2O_2$—HCl, at a temperature between about 65 to 70° C. This is shown schematically in FIG. 4. The wet etch procedure does not attack, or degrade the C49, metal silicide regions 8a. A critical silicon oxide layer 9, shown schematically in FIG. 5, is next deposited via PECVD procedures, at a thickness between about 250 to 350 Angstroms. Capping silicon oxide layer 9, comprised with a compressive stress, alleviates, or balances, the tensile stress exhibited by the C49 salicide phase region, or by a subsequent C54 salicide phase, which reduces the risk of salicide peeling, or adhesion loss, from the top surface of a polysilicon gate structure, or word line. The risk of peeling, or adhesion loss of salicide from polysilicon, is increased with decreasing width of the polysilicon word line, therefore for aggressive MOSFET devices, featuring narrow width polysilicon word lines, balancing the tensile stress of salicide regions, with an overlying silicon oxide, comprised with a compressive stress, is critical. In addition capping silicon oxide layer 9, will protect underlying salicide regions from the ambient of a subsequent anneal cycle.

Figure 6:
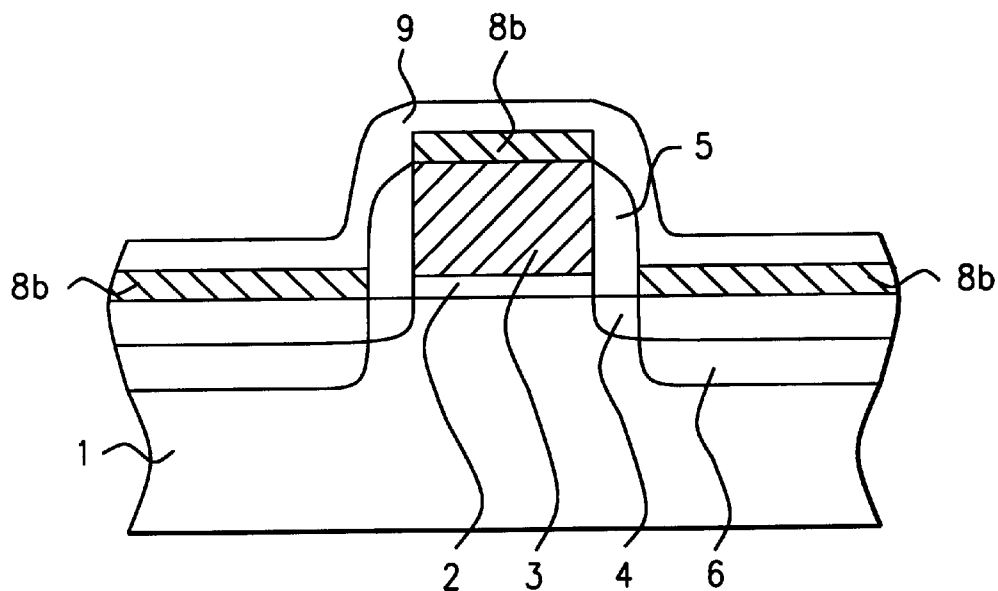

A second RTA procedure is next performed at a temperature between about 800 to 900° C., for a time between about 25 to 35 sec, in a nitrogen or argon ambient, resulting in the conversion of C49 phase, titanium disilicide region 8a, to C54 phase, titanium disilicide region 8b. This is shown schematically in FIG. 6. The C49 phase, titanium disilicide layer 8b, is formed with a sheet resistance between about 4 to 5 ohms/square. The use of capping silicon oxide layer 7, featuring a compressive stress, not only reduced the risk of titanium disilicide peeling, but prevented exposure of C54 phase, titanium disilicide regions 8b, from the RTA ambient. The nitrogen ambient, or oxygen impurities in the nitrogen, or argon ambient, would have deleteriously increased the sheet resistance of C54 phase, titanium disilicide regions 8b.

Figure 7:
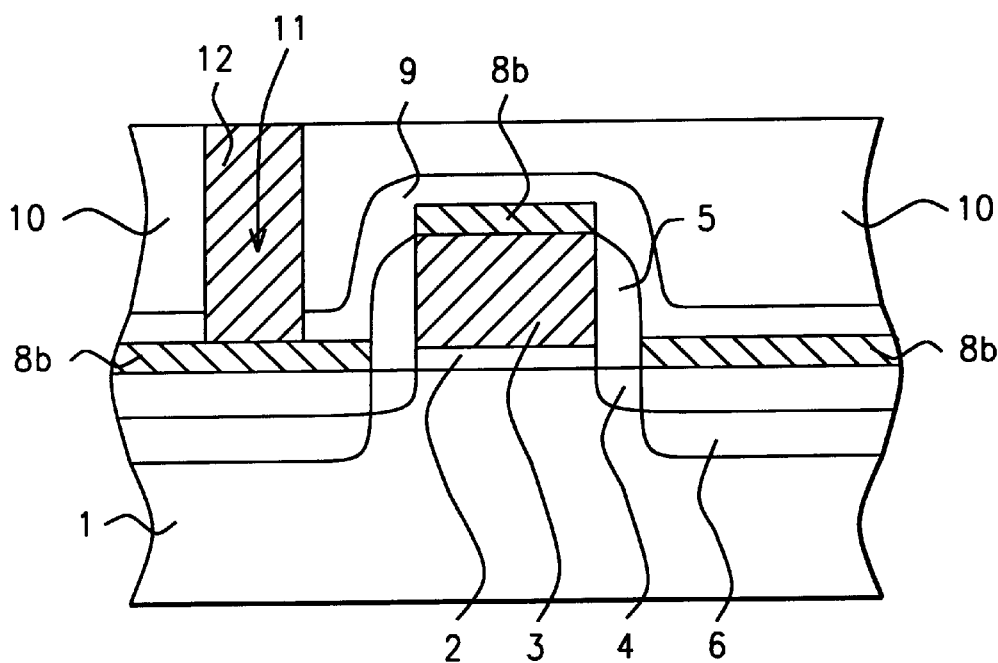

FIG. 7, schematically shows the formation of a metal plug structure, contacting C54 phase, titanium disilicide region 8b, in an area overlying heavily doped source/drain region. First an interlevel dielectric, (ILD), layer 10, is deposited via PECVD or LPCVD procedures, at a thickness between about 7000 to 9000 Angstroms. A chemical mechanical polishing, (CMP), procedure is used to planarize the top surface of ILD layer 10. Conventional photolithographic and selective RIE procedures, using $CHF_3$ as an etchant, are used to form contact hole opening 11, in ILD layer 10, and in capping silicon oxide layer 9, exposing a portion of the top surface of C54 phase, titanium disilicide region 8b, in an area in which the salicide region is located on heavily doped source/drain region 6. After removal of the photoresist shape, used to define contact hole opening 11, via plasma oxygen ashing and careful wet cleans, a metal layer, such as tungsten, is deposited via PVD, or via LPCVD procedures, to a thickness between about 3500 to 4500 Angstroms, completely filling contact hole opening 11. A CMP, or a selective RIE procedure, using $Cl_2$ of $SF_6$ as an etchant, is used to remove regions of the metal layer from the top surface of ILD layer 10, resulting in the formation of metal plug structure 12, in contact hole opening 11, overlying and contacting, a portion of C54 phase, titanium disilicide region 8b.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal silicide region, for a metal oxide semiconductor field effect transistor, (MOSFET), device, on a semiconductor substrate, comprising the steps of:

forming a polysilicon gate structure, on an underlying gate insulator layer;

forming insulator spacers on the sides of said polysilicon gate structure;

forming a heavily doped source/drain region located in a region of said semiconductor substrate, not covered by said polysilicon gate structure, or by said insulator spacers;

depositing a metal layer;

performing a first anneal procedure to form a first phase, metal silicide region on the top surface of said polysilicon gate structure, and on the top surface of said heavily doped source/drain region, with portions of said metal layer, located on said insulator spacers, remaining unreacted;

removing said portions of said metal layer, from said insulator spacers;

depositing a capping silicon oxide layer, with said capping silicon oxide layer comprised with a compressive stress;

performing a second anneal procedure, convert said first phase, metal silicide region, to a second phase, metal silicide phase;

depositing an interlevel insulator layer;

performing a planarization procedure;

forming a via hole in said interlevel insulator layer, and in said capping silicon oxide layer, exposing a portion of the top surface of a second phase, metal silicide region that resides on a heavily doped source drain/region; and forming a metal plug structure in said via hole.

2. The method of claim 1, wherein the width of said polysilicon gate structure is between about 2000 to 2400 Angstroms.

3. The method of claim 1, wherein said insulator spacers are comprised of silicon oxide, or of silicon nitride.

4. The method of claim 1, wherein said metal layer is a titanium layer, obtained via PVD procedures, at a thickness between about 250 to 350 Angstroms.

5. The method of claim 1, wherein said first anneal procedure is a rapid thermal anneal, (RTA), procedure, performed at a temperature between about 700 to 770° C., for a time between about 25 to 35 sec., in a nitrogen or argon ambient.

6. The method of claim 1, wherein said first phase, metal silicide layer, is a C49 phase, titanium disilicide layer, comprised with a tensile stress, and with a sheet resistance between about 20 to 25 ohms/square.

7. The method of claim 1, wherein said capping silicon oxide layer is obtained via PECVD procedures, at a thickness between about 250 to 350 Angstroms, with said capping silicon oxide layer comprised with a compressive stress.

8. The method of claim 1, wherein said second anneal procedure is an RTA procedure, performed at a temperature between about 800 to 900° C., for a time between about 25 to 35 sec., in an nitrogen or argon ambient.

9. The method of claim 1, wherein said second phase, metal silicide layer, is a C54 phase, titanium disilicide layer, with a sheet resistance between about 4 to 5 ohms/square.

10. The method of forming a low resistance phase, titanium disilicide layer, on regions of a MOSFET device, featuring a capping silicon oxide layer, deposited prior to a second anneal procedure, in turn used to convert a high resistance phase, titanium disilicide layer, to said low resistance phase, titanium disilicide layer, comprising the steps of:

providing said MOSFET device, on a semiconductor substrate, comprised with: a narrow width polysilicon gate structure, on an underlying gate insulator layer; insulator spacers on the sides of said narrow width polysilicon gate structure; and a heavily doped source/drain region located in a region of said semiconductor substrate, not covered by said narrow width polysilicon gate structure, or by said insulator spacers, depositing a titanium layer;

performing a first anneal procedure to form said high resistance phase, titanium disilicide layer, on the top surface of said narrow width polysilicon gate structure, and on the surface of said heavily doped source/drain region, with said high resistance phase, titanium disilicide layer comprised with a tensile stress;

removing regions of said titanium layer, from the surface of said insulator spacers;

deposing a capping silicon oxide layer, comprised with a compressive stress;

performing said second anneal procedure, converting said high resistance phase, titanium disilicide layer, to said low resistance phase, titanium disilicide layer;

depositing an interlevel insulator layer on said blanket capping silicon oxide layer;

performing a chemical mechanical polishing procedure to create a smooth top surface topology for said interlevel insulator layer;

forming a via hole in said interlevel insulator layer, and in said blanket capping silicon oxide layer, exposing a portion of a top surface of a low resistance, titanium disilicide layer which in turn is located on a heavily doped source/drain region; and forming a tungsten plug structure in said via hole.

11. The method of claim 10, wherein the width of said narrow width polysilicon gate structure is between about 2000 to 2400 Angstroms.

12. The method of claim 10, wherein said insulator spacers are comprised of silicon oxide, or of silicon nitride, at a thickness between about 1300 to 1700 Angstroms.

13. The method of claim 10, wherein said titanium layer is obtained via PVD procedures, at a thickness between about 250 to 350 Angstroms.

14. The method of claim 10, wherein said first anneal procedure is a rapid thermal anneal, (RTA), procedure, performed at a temperature between about 700 to 770° C., for a time between about 25 to 35 sec., in a nitrogen or argon ambient.

15. The method of claim 10, wherein said high resistance phase, titanium disilicide layer, on the top surface of said narrow width polysilicon gate structure, is a C49 phase, titanium disilicide layer, comprised with a tensile stress, and with a sheet resistance between about 20 to 25 ohms/square.

16. The method of claim 10, wherein said capping silicon oxide layer is obtained via PECVD procedures, at a thickness between about 250 to 350 Angstroms, with said capping silicon oxide layer comprised with a compressive stress.

17. The method of claim 10, wherein said second anneal procedure is an RTA procedure, performed at a temperature between about 800 to 900° C., for a time between about 25 to 35 sec., in an nitrogen or argon ambient.

18. The method of claim 10, wherein said high resistance phase, titanium disilicide layer is a C54 phase, titanium disilicide layer, with a sheet resistance between about 4 to 5 ohms/square.

* * * * *